United States Patent
Ota (10) Patent No.: US 8,068,362 B2
(45) Date of Patent: Nov. 29, 2011

(54) NON-VOLATILE SEMICONDUCTOR MEMORY DEVICE AND METHOD OF READING THE SAME

(75) Inventor: Tsuyoshi Ota, Tokyo (JP)

(73) Assignee: Powerchip Technology Corporation, Hsin-Chu (TW)

( * ) Notice: Subject to any disclaimer, the term of this patent is extended or adjusted under 35 U.S.C. 154(b) by 181 days.

(21) Appl. No.: 12/633,031

(22) Filed: Dec. 8, 2009

(65) Prior Publication Data
US 2010/0157673 A1 Jun. 24, 2010

(30) Foreign Application Priority Data
Dec. 9, 2008 (JP) ................................ 2008-313309

(51) Int. Cl.
*G11C 16/04* (2006.01)
*G11C 16/06* (2006.01)
(52) U.S. Cl. .............................. 365/185.03; 365/185.25
(58) Field of Classification Search ............. 365/185.03, 365/185.25, 185.17
See application file for complete search history.

(56) References Cited

U.S. PATENT DOCUMENTS

| 7,254,064 | B2 * | 8/2007 | Kim et al. ............... | 365/189.05 |
|---|---|---|---|---|
| 7,684,238 | B2 * | 3/2010 | Mo ............................ | 365/185.03 |
| 2005/0018488 | A1 * | 1/2005 | Kim et al. ................. | 365/185.28 |
| 2009/0103360 | A1 * | 4/2009 | Kang et al. ............... | 365/185.03 |

FOREIGN PATENT DOCUMENTS

| JP | H09-147582 | 6/1997 |
|---|---|---|
| JP | 2000-285692 | 10/2000 |
| JP | 2001-28575 | 1/2001 |
| JP | 2003-346485 | 12/2003 |
| JP | 2007-28575 | 2/2007 |

* cited by examiner

*Primary Examiner* — Andy Phung
(74) *Attorney, Agent, or Firm* — Muncy, Geissler, Olds & Lowe, PLLC (57) ABSTRACT

A non-volatile semiconductor memory device capable of preventing reading failure during the occurrence of the FG-FG coupling effect is disclosed. The non-volatile semiconductor memory device includes a memory cell array, each cell of which stores at least two bits, such as LSB and MSB, using different threshold voltages. In addition, the device includes a control circuit for controlling the data-reading operation of the memory cell array. When the reading operation of the memory cells of a first word line is performed, the memory cells of a second word line adjacent to the first word line are examined to determine whether the writing operation of the MSB is performed. If the writing operation of the MSB is performed, a pre-charge voltage of the bit lines connecting to the memory cells of the first word line is reduced to a predetermined voltage for canceling out the raising of the threshold voltage caused by the coupling effect between gate electrodes.

10 Claims, 11 Drawing Sheets

FIG. 11 though the transistors Q8 and Q9. The transistor Q9 is con-
NON-VOLATILE SEMICONDUCTOR MEMORY DEVICE AND METHOD OF READING THE SAME

DESCRIPTION OF THE INVENTION

1. Field of the Invention

The invention relates to a non-volatile electrically-erasable programmable read-only memory (EEPROM), such as a flash memory, and a reading method thereof.

2. Description of the Related Art

A current NAND-type non-volatile semiconductor is composed of an NAND-type string which comprises a plurality of memory cell transistors (referred as memory cells) coupled in series between bits lines and source lines. Thus, a high-density capability for the semiconductor is accomplished (referring to Patent Reference 1-4).

In a general NAND-type non-volatile semiconductor memory device, an erasing operation is performed by applying a high voltage, such as 20V, to the semiconductor substrate and applying 0V to the word lines. Accordingly, electrons can be induced from the floating gates which are composed of poly-sillcon and operate as charge accumulation layers, so that the threshold voltage is lower then erasing threshold voltage (such as −3V). Moreover, during a writing operation, the semiconductor substrate is applied by 0V, and the control gates are applied by a high voltage 20V. Accordingly, by injecting electrons to the floating gates from the semiconductor substrate, the threshold voltage is higher than the writing threshold voltage (such as 1V). Thus, the control gate of a memory cell is applied by a reading voltage (such as 0V) between the writing threshold voltage and the erasing threshold voltage, and then the state of the memory cell is determined according to the current passing through the memory cell.

For example, Patent Reference 5 discloses a non-volatile semiconductor memory device. The capacitor coupling effect between the non-volatile memory cells (that is the capacitor coupling effect between the floating gates, referred as FG-FG coupling) may cause value variation in the threshold voltage. As a result, the writing failure can not be detected. Thus, the following method is provided. In detail, a non-volatile electrically-erasable programmable memory cell which performs multi-voltage storage comprises a writing unit for storing data, non-volatile memory cells which are selected for information writing, and non-volatile memory cells which are not selected for information writing. When the writing unit performs the writing process, the threshold voltages of the selected non-volatile memory cells are set to remain in a required range for one polarity by writing a verification voltage. For the result of the writing process, the writing unit reads stored information from the selected non-volatile memory cell and the non-selected non-volatile memory cell according to an upper determination voltage. Among the read information, the information read from the non-selected non-volatile memory cell is excluded from the reference for determining whether the writing process is successful. Accordingly, the situation of that FG-FG coupling effect causes the value variation of the threshold voltage and the writing failure is not detected can be prevented.

Figure 3:
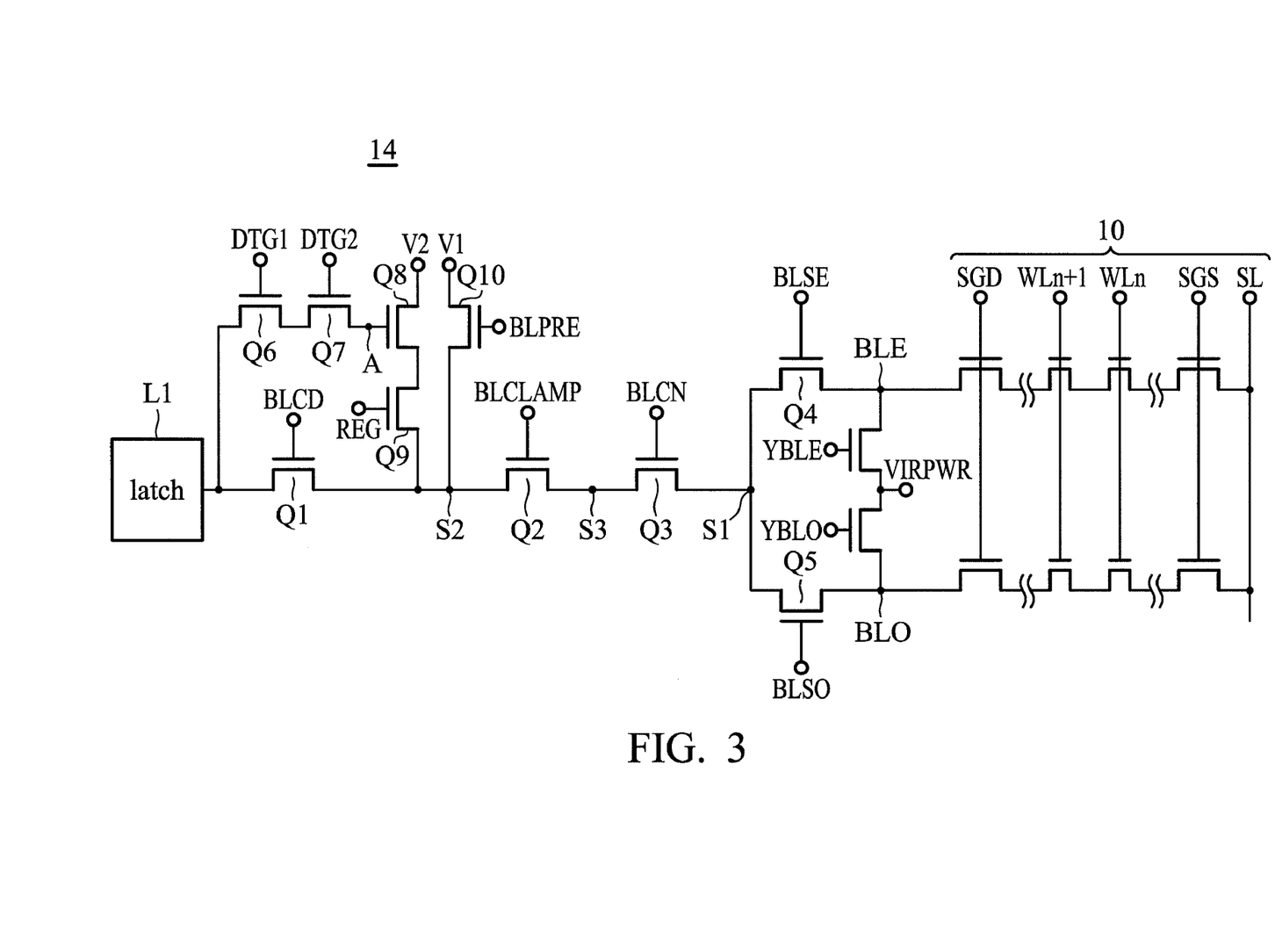
FIG. 3 shows a page buffer 14 and the memory cell array 10 according to conventional prior arts and the first and second embodiments.

FIG. 3 shows a conventional page buffer 14 and a memory cell array 10 (only one pair of bit lines BLE and BLO is shown in FIG. 3). In FIG. 3, the memory cell array 10 comprises one pair of the bit lines BLE and BLO which respectively connect memory cells in series. The control voltages YBLE and YBLO are used to control the voltages on the bit lines BLE and BLO by connecting one of the bit lines BLE and BLO to the ground VIRPWR. Moreover, BLCK, BLCAMP, BLCN, BLSE, and BLSO are also control voltages for controlling the bit lines. The latch L1 of the page buffer 14 is coupled to the node S1 through field effect transistors (referred as transistors) Q1 and Q2, the node S2, and the transistor Q3. The node S1 is coupled to the bit line BLE through the transistor Q4 and further coupled to the bit line BLO through the transistor Q5.

In the page buffer 14, the pre-charge voltage V1 is coupled to the node S2 through the transistor Q10 whose gate is applied by the pre-charge control voltage BLPRE. Moreover, the programming control voltage V2 is coupled to the node S2 trolled by the control voltage REG, and the transistor Q8 is controlled by the voltage which passes through the transistors Q6 and Q7 from the latch L1. The transistor Q6 is controlled by the programming control voltage DTG1, and the transistor Q7 is controlled by programming control voltage DTG2.

[Patent Reference 1] Japan Publication No. 9-147582
[Patent Reference 2] Japan Publication No. 2000-285692
[Patent Reference 3] Japan Publication No. 2003-346485
[Patent Reference 4] Japan Publication No. 2001-028575
[Patent Reference 5] Japan Publication No. 2007-149186

BRIEF SUMMARY OF THE INVENTION

Figure 5:
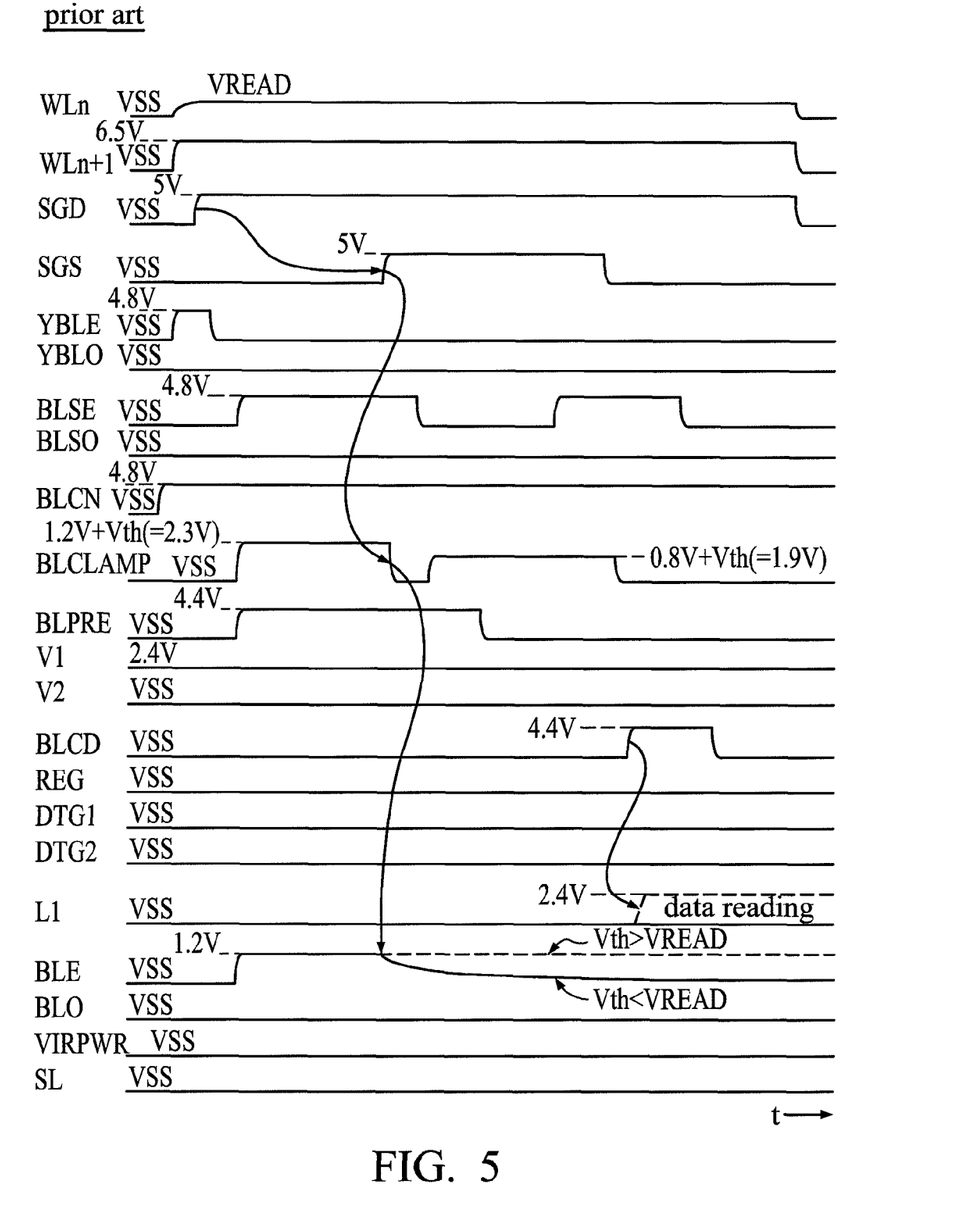
FIG. 5 is a timing chart of a reading operation of a convention NAND-type flash EEPROM.

FIG. 5 is a timing chart of a reading operation of a convention NAND-type flash EEPROM. During the reading operation, the word line which is selected (referred as the selected word line) WLn is at VREAD (varies with the readout value). For the other word lines disposed in a block which is composed of 32 word lines and disposed between the transistor of the control voltage SGD and the transistor of the control voltage SGS, the word line which is not selected (referred as the non-selected word line) is set as a voltage (=6.5V). According to FIG. 5, the bit line BLE or BLO is pre-charged to 1.2V, and the transistor of the control voltage SGD and the transistor of the control voltage SGS are turned on. Then, the discharging from the memory cell begins (referred as memory discharging). According to the threshold voltage Vth of the selected memory cell, the potential of the bit line changes after the memory discharging finishes. The voltage of the bit line is compared in the page buffer 14 to determine whether the data which is latched by and read from the latch L1 is at a high voltage level or a low voltage level. FIG. 5 shows the case which determines that the voltage latched by the latch L1 is at a high voltage level (solid lines) or a low voltage level (dotted line).

However, with the reduction of the process size, for one memory cell in a floating NAND-type flash memory, since the memory cells disposed on the adjacent word line or bit line to the one memory cell perform data writing, the threshold voltage Vth of the memory cell which performs the data writing in advance is raised due to the FG-FG effect, resulting in reading failure.

The invention provides a non-volatile semiconductor memory device capable of preventing reading failure during the occurrence of the FG-FG coupling effect.

A non-volatile semiconductor memory device according to the first embodiment comprises a non-volatile memory cell array, a control circuit, and a buck circuit. The non-volatile memory cell array stores at least two bits including a least significant bit (LSB) and a most significant bit (MSB) by using different threshold voltages in each of memory cells of the memory cell array. The control circuit controls a data reading operation to the memory cell array. When the memory cells coupled to a first word line perform the data reading operation, the memory cells coupled to a second word line adjacent to the first word line are examined to determine whether a writing operation of the MSB is performed. If the writing operation of the MSB is performed, the buck circuit reduces a pre-charge voltage of a bit line performing a data reading operation of the memory cells coupled to the first word line by a predetermined voltage for canceling out the raising of threshold voltages caused by coupling effect between gates of storage nodes in the memory cells coupled to two adjacent word lines.

In the above non-volatile semiconductor memory device, the buck circuit pre-charges all bit lines by a predetermined low voltage which is lower than the pre-charge voltage in the beginning. Then, when the memory cells coupled to the second word line adjacent to the first word line are examined to determine that the writing operation of the MSB is performed, the buck circuit raises voltages on the bit lines, excluding the bit line performing the data reading operation, to the pre-charge voltage by controlling a gate voltage of a transistor disposed between a first circuit providing the pre-charge voltage and the bit line performing the data reading operation.

Moreover, in the non-volatile semiconductor memory device, when the memory cells coupled to the second word line adjacent to the first word line are examined to determine that the writing operation of the MSB is performed, the buck circuit couples the bit line performing the data reading operation to a voltage source whose voltage is lower then the pre-charge voltage through a second circuit for reducing the pre-charge voltage by the predetermined voltage. The second circuit provides a programming voltage to the bit line performing the data reading operation.

In the non-volatile semiconductor memory device, the buck circuit serves as a third circuit which is additionally disposed and different from the first circuit providing the pre-charge voltage. One terminal of the third circuit is coupled to a node between the first circuit and the bit line, and the other terminal thereof is coupled to a voltage source whose voltage is lower than the pre-charge voltage by the predetermined voltage. When the memory cells coupled to the second word line adjacent to the first word line are examined to determine that the writing operation of the MSB is performed, the pre-charge voltage of the bit line coupled to the first word line and performing the data reading operation is coupled to the voltage source through the third circuit for reducing the pre-charge voltage by the predetermined voltage.

Further, in the non-volatile semiconductor memory device, the writing operation of the MSB is an operation to write at least one specific level into the MSB.

A reading method for a non-volatile semiconductor memory device according to the second embodiment is provided. The non-volatile semiconductor memory device comprises a non-volatile memory cell array and a control unit. The non-volatile memory cell array stores at least two bits including a least significant bit (LSB) and a most significant bit (MSB) by using different threshold voltages in each of the memory cells of the memory cell array. The control circuit controls a data reading operation to the memory cell array. The reading method comprises: when the memory cells coupled to a first word line perform the data reading operation, examining the memory cells coupled to a second word line adjacent to the first word line to determine whether a writing operation of the MSB is performed; and if the writing operation of the MSB is performed, reducing a pre-charge voltage of a bit line performing a data reading operation to the memory cells coupled to the first word line by a predetermined voltage for canceling out the raising of threshold voltages caused by the coupling effect between gates of storage nodes in the memory cells coupled to two adjacent word lines.

In the reading operation for the non-volatile semiconductor memory device, the step of reducing the pre-charge voltage comprises: pre-charging all bit lines by a predetermined low voltage which is lower than the pre-charge voltage in the beginning. The step of reducing the pre-charge voltage further comprises: when the memory cells coupled to the second word line adjacent to the first word line are examined to determine that the writing operation of the MSB is performed, raising voltages on the bit lines, excluding the bit line performing the data reading operation, to the pre-charge voltage by controlling a gate voltage of a transistor disposed between a first circuit providing the pre-charge voltage and the bit line performing the data reading operation.

Moreover, in the reading operation for the non-volatile semiconductor memory device, the step of reducing the pre-charge voltage comprises: when the memory cells coupled to the second word line adjacent to the first word line are examined to determine that the writing operation of the MSB is performed, coupling the bit line performing the data reading operation to a voltage source whose voltage is lower then the pre-charge voltage through a second circuit for reducing the pre-charge voltage by the predetermined voltage. The second provides a programming voltage to the bit line performing the data reading operation.

In the reading operation for the non-volatile semiconductor memory device, the non-volatile semiconductor memory device further comprises a third circuit which is different from the first circuit providing the pre-charge voltage and disposed additionally. One terminal of the third circuit is coupled to a node between the first circuit and the bit line, and the other terminal thereof is coupled a voltage source whose voltage is lower than the pre-charge voltage by the predetermined voltage. The step of reducing the pre-charge voltage comprises: when the memory cells coupled to the second word line adjacent to the first word line are examined to determine that the writing operation of the MSB is performed, coupling the pre-charge voltage of the bit line coupled to the first word line and performing the data reading operation to the voltage source through the third circuit for reducing the pre-charge voltage by the predetermined voltage.

Further, in the reading operation for the non-volatile semiconductor memory device, the writing operation of the MSB represents an operation to write at least one specific level into the MSB.

Thus, in the non-volatile semiconductor memory device and the reading method therefore, when the data reading operation is performed to the memory cells coupled to the first word line, the memory cells coupled to the second word line adjacent to the first word line are examined to determine whether the writing operation of the MSB is performed. If the writing operation of the MSB is performed, the pre-charge voltage of the bit lines performing the data reading operation to the memory cells coupled to the first word line is reduced by a predetermined voltage for canceling out the raising of the threshold voltages caused by the coupling effect between the storage nodes in the memory cells coupled to two adjacent word lines. Accordingly, when the memory cells coupled to the first word line perform the data reading operation, the raising of the threshold voltages Vth caused by the FG-FG coupling effect during the writing operation of the MSB for the memory cells coupled to the second word line is cancelled out. The reading failure can be prevented even if the FG-FG coupling effect occurs.

DETAILED DESCRIPTION OF THE INVENTION

The embodiments of the invention are described by reference to drawings. Moreover, in the embodiments, the same elements are labeled by the same symbols.

Figure 1:
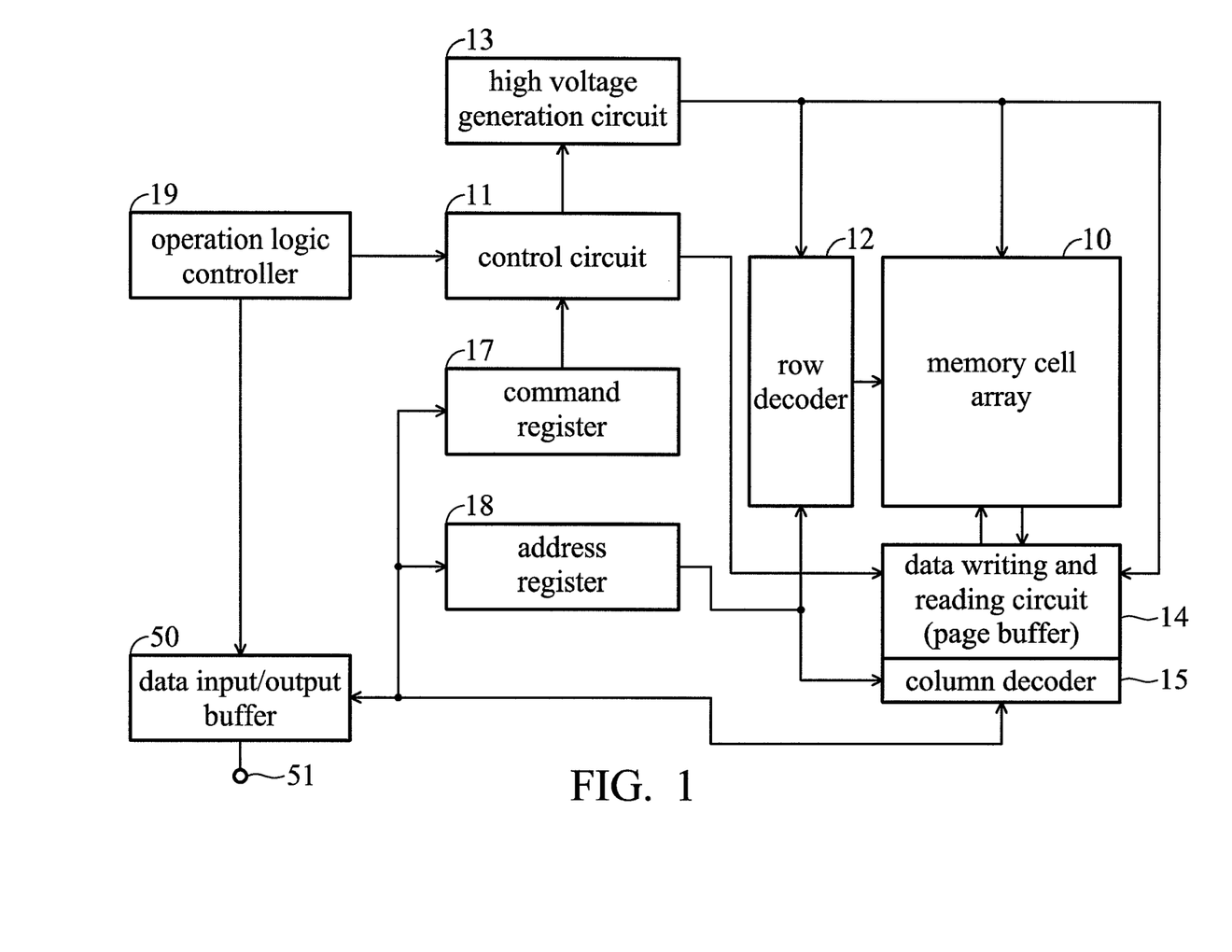
FIG. 1 is a block diagram of an exemplary embodiment of an NAND-type flash EEPROM.
Figure 2:
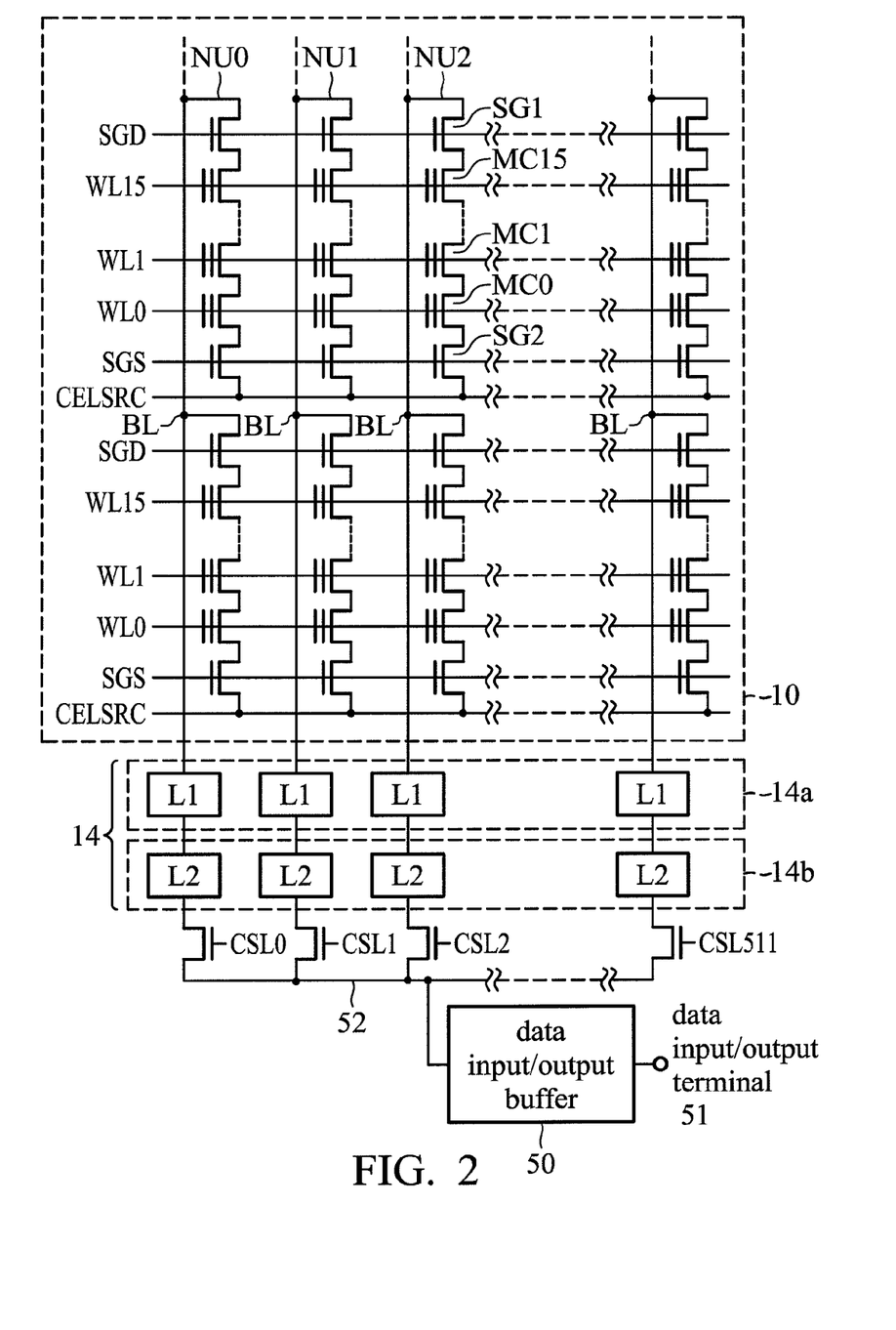
FIG. 2 shows a memory cell array 10 and the peripheral circuitry of the memory cell array 10.

FIG. 1 is a block diagram of an exemplary embodiment of an NAND-type flash EEPROM. Moreover, FIG. 2 shows a memory cell array 10 and the peripheral circuitry of the memory cell array 10. In the following, the structure of the NAND-type flash EEPROM of the embodiment is described first.

In FIG. 1, the NAND-type flash EEPROM comprises the memory cell array 10, a control circuit 11 for controlling the NAND-type flash EEPROM, a row decoder 12, a high voltage generation circuit 13, a data writing and reading circuit 14, a column decoder 15, an command register 17, an address register 18, an operation logic controller 19, a data input/output buffer 50, and a data input/output terminal 51.

As shown in FIG. 2, the memory cell array 10 comprises NAND-type cell units NU (NU0. NU1 . . . ), and each cell unit comprises 16 non-volatile electrically-erasable programmable memory cells MC0-MC15 with a stacked gate structure which are coupled in series. In each NAND-type cell unit NU, the drain side is coupled to the bit line BL through the selection gate transistor SG1, and the source side is coupled to the common source line CELSRC through the selection gate transistor SG2. The control gates of the transistor cells which are disposed side by side in one row are coupled to the same word line WL. The gates of the selection gate transistors SG1 and SG2 are respectively coupled to the selection gate lines SGD and SGS which are parallel to the word line WL. The area of the memory cells selected by one word line serves as one page which is a unit for data writing and reading operations. The area of one page or the area of NAND-type cell units NU in which the number of memory units is an integer multiple of the number of memory units in one page serves as one block which is a unit for the data erasing operation. The writing and reading circuit 14 comprises a sensing amplification circuit (SA) and latch circuits (DL), which are disposed on each bit line, and further performs the data writing and reading operations by using one page as a unit. The writing and reading circuit 14 is referred as a page buffer in the following.

In the memory cell array 10 in FIG. 2, several bit lines can share one page buffer to simplify circuitry structure. In this case, during the data writing and reading operations, the number of bit lines selectively coupled to the page buffer serves as a unit for one page. Moreover, FIG. 2 shows that the cell array area performs data inputting and outputting operations with one data input/output terminal 51. In order to perform selection operations on the word lines WL and the bit lines BL of the memory cell array 10, the row decoder 12 and the column decoder 15 are disposed. The control circuit 11 performs sequence control of data writing, erasing, and reading operations. The high voltage generation circuit 13 controlled by the control circuit 11 generates a raised high voltage and a raised middle voltage used for data writing, erasing, and reading operations.

The data input/output buffer 50 is used for data inputting/outputting and address signal inputting. In other words, the data transmission between the data input/output terminal 51 and the page buffer 14 is performed through the data input/output buffer 50 and the data line 52. The address signals input from the data input/output terminal 51 is stored in the address register 18 and then transmitted to the row decoder 12 and the column decoder 15. The commands for operation control are also input from the data input/output terminal 51.

After the commands are decoded, the decoded commands are stored in the command register 17, thereby controlling the control circuit 11. External control signals including a chip enabling signal (CEB), a command latch enable signal (CLE), address latch enable signal (ALE), a writing enable signal (WEB), and a reading enable signal (REB) are retrieved to the operation logic controller 19, and the operation logic controller 19 generates internal control signals in response to operation modes. The internal control signals are used to control the data latch and transmission of the data input/output buffer 50, and the internal control signals is further transmitted to the control circuit 11 for performing operation control.

The page buffer 14 comprises two latch circuits 14a and 14b capable of switching a multi-value operation function and a cache function. For example, a memory cell storing a value "2" of 1 bit has a cache function, while a memory cell storing a value "4" of 2 bits has an effective cache function or a cache function limited by addresses.

Figure 4:
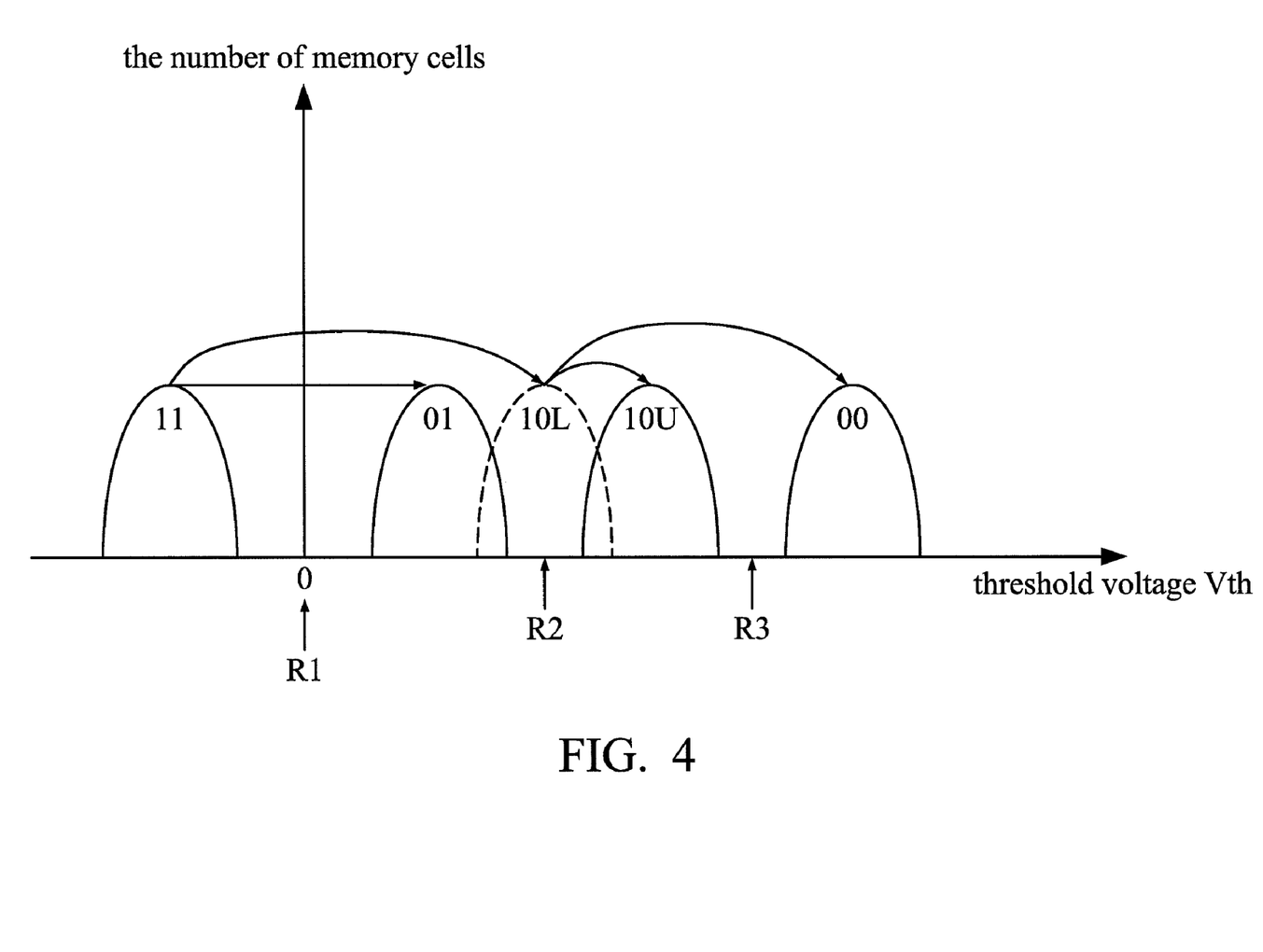
FIG. 4 shows the distribution of the threshold voltage according to conventional prior arts and the first to third embodiments.

In the following, the method for canceling out the raising of the threshold voltages Vth of the memory cells caused by the FG-FG coupling effect will be described. The circuitry in FIG. 3 is used for both the first embodiment and the second embodiment. In the embodiment, a NAND-type flash EEPROM with multi-value storage is used, and the distribution of the threshold voltage Vth is shown in FIG. 4. As shown in FIG. 4, "11" indicates that no data is written. After the least significant bit (LSB) is written (data "11"→"10L"), the most significant bit (MSB) is written (data "11"→"01" or data "10L"→"00", and data "10L" becomes "10U"). R1, R2, and R3 represent data output voltages.

Figure 6:
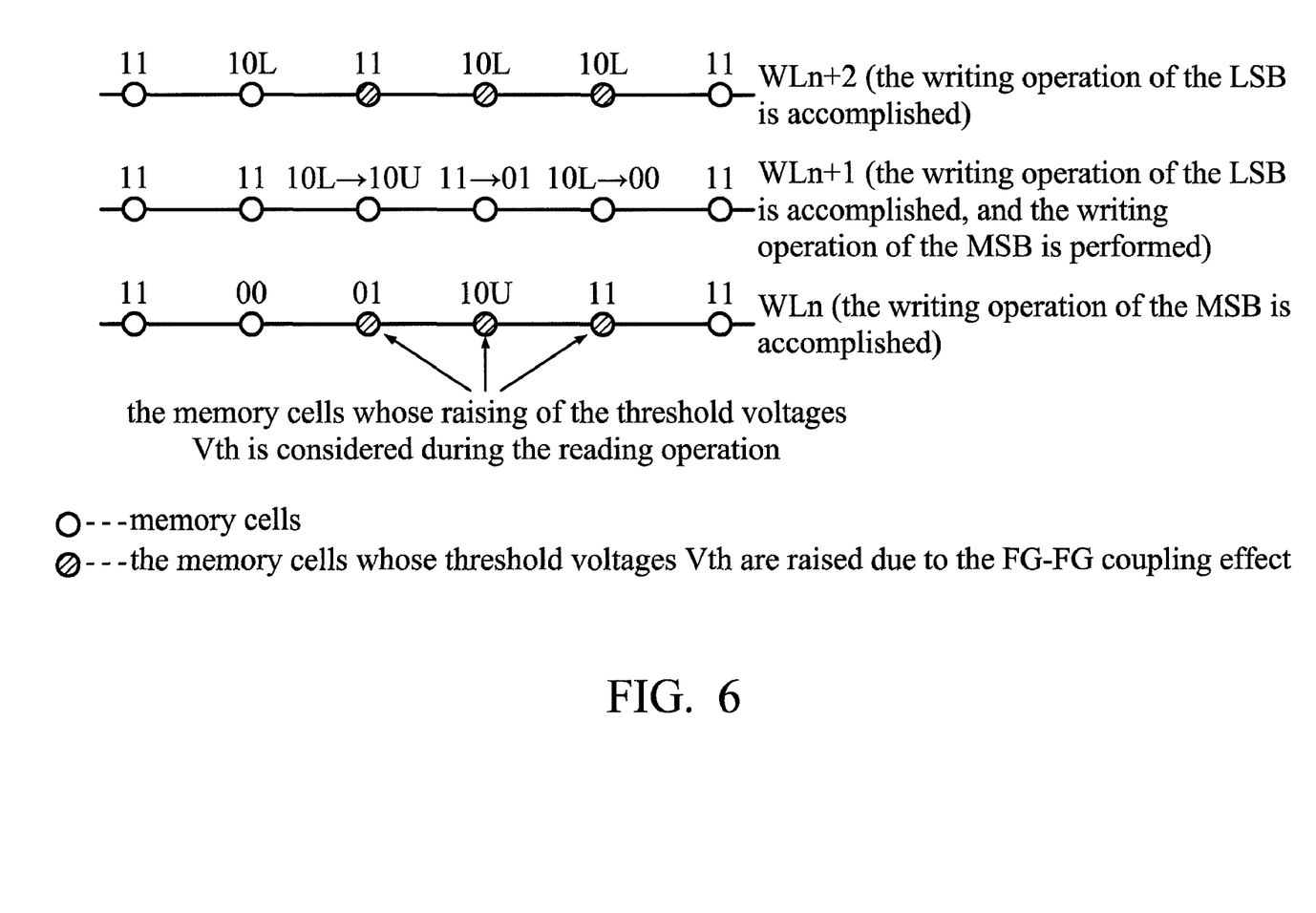
FIG. 6 shows the memory cell array of the memory cells whose threshold voltages are raised due to the FG-FG effect for describing the prior arts.

FIG. 6 shows the memory cell array of the memory cells whose threshold voltages are raised due to the FG-FG effect. The problems, which are induced by the raising of the threshold voltages caused by the FG-FG coupling effect, occur in a first group of the memory cells and a second group of the memory cells. Wherein, the writing operation of the MSB to the first group of the memory cells is accomplished, while the writing operation of the LSB to the second group of the memory cells is accomplished and the writing operation of the MSB to the memory cells on the word line adjacent to the second group of the memory cells is performed. The writing operation of an NAND-type flash memory has a predetermined sequence. In FIG. 6, the sequence of the writing operation of the MSB is the disposition order of the word lines. Assuming that the word line WLn+1 performs the writing operation of the MSB. The threshold voltages Vth on the word lines WLn and WLn+2 are raised due to the FG-FG coupling effect. Compared with the word line WLn, since the word line WLn+2 then perform the writing operation of the MSB to write the next address, the raising of the threshold voltages in the word line WLn+2 caused by the coupling effect is not significant. The above description of FIG. 6 is applied to the first, second, and third embodiments.

In the first and second embodiments, the page buffer 14 in FIG. 3 is used to change the pre-charge voltage of the bit lines. In the third embodiment, a circuit in FIG. 11 replaces the circuit in FIG. 3 for changing the pre-charge voltage of the bit lines.

The non-volatile semiconductor memory device of the embodiments comprises a non-volatile memory cell array 10 where each memory cell stores at least two bits LSB and MSB by setting a plurality of different threshold voltages. Moreover, the non-volatile semiconductor memory device of the embodiments further comprises control circuit 11 used to control the data reading operation from the memory cell array 10. The non-volatile semiconductor memory device is characterized in that: when the memory cells coupled to the word line WLn perform the data reading operation, the memory cells coupled to the word line WLn+1 adjacent to the word line WL are examined to determine whether the writing operation of the MSB is performed; if the memory cells coupled to the word line WLn+1 is examined to determine that the writing operation of the MSB is performed, the pre-charge voltage of the bit lines performing the data reading operation to the memory cells coupled to the word line WLn is reduced by a predetermined voltage for canceling out the raising of the threshold voltages of the memory cells between the two adjacent word lines WLn and WLn+1 caused by the FG-FG coupling effect.

First Embodiment

Figure 7:
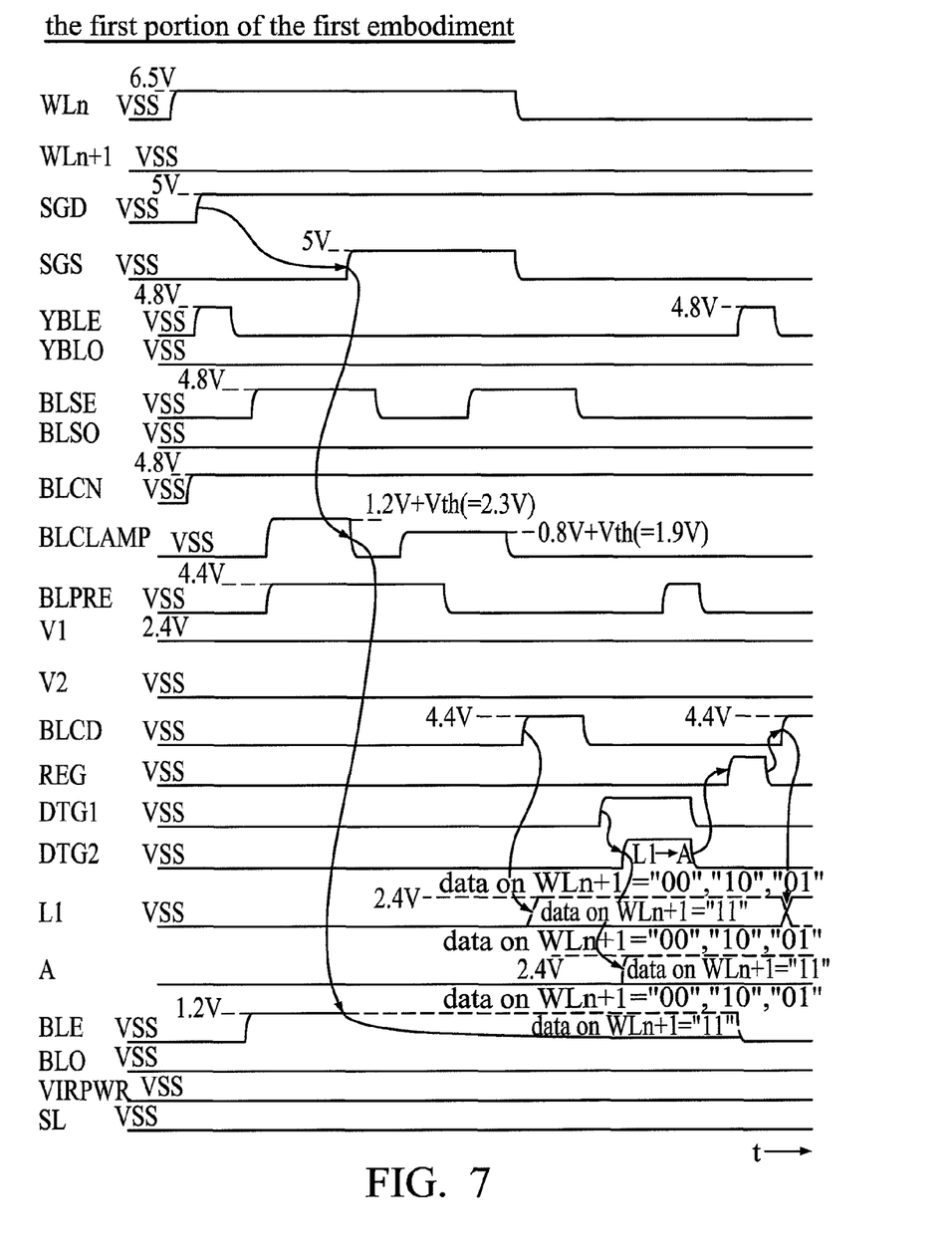
FIG. 7 is a timing chart of the first portion of the reading operation sequence of the NAND-type flash EEPROM according to the first embodiment.
Figure 8:
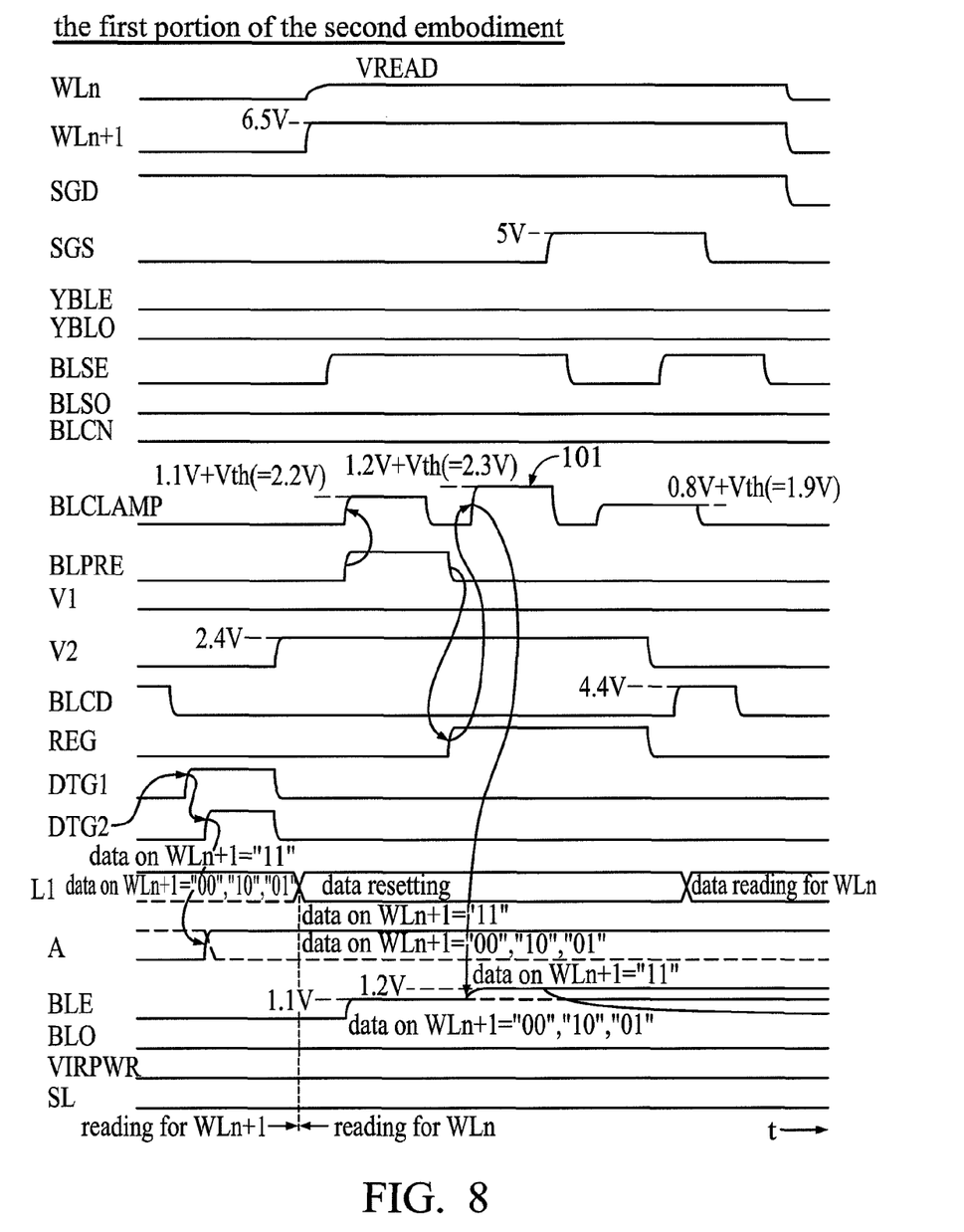
FIG. 8 is a timing chart of the second portion of the reading operation sequence of the NAND-type flash EEPROM according to the first embodiment.

FIGS. 7 and 8 show a timing chart of a reading operation of the NAND-type flash EEPROM of the first embodiment. The NAND-type flash EEPROM of the first embodiment is characterized in that: the pre-charge voltage of the bit lines are changed by the data of the memory cells coupled to an adjacent word line. Concretely, in the beginning, all of the bit lines are pre-charged by a predetermined low voltage which is lower than the above pre-charge voltage for the pre-charging operation. Then, when the memory cells coupled to the word line WLn+1 adjacent to the word line WLn are examined to determine whether the writing operation of the MSB is performed, the voltages on the bit lines excluding the bit line performing the data reading operation are raised to the pre-charge voltage by controlling the gate voltage BLCLAMP of the transistor Q2 between the circuit (the voltage V1 and the transistor Q10) providing pre-charge voltage and the bit line performing the data reading operation. Accordingly, compared with other bit lines, only the bit line performing the data reading operation is reduced by the raising degree of the threshold voltages caused by the FG-FG coupling effect.

Referring to FIGS. 7 and 8, the sequence of the reading operation of the first embodiment is described.

Assume that the memory cells coupled to the word line WLn are the target for the reading operation. First, the reading operation is performed to the memory cells coupled to the word line WLn+1. At this time, the voltage on the word line WLn+1 is the reading voltage, that is VREAD=R1. When the data of one memory cell coupled to the word line WLn+1 is "11", the reading result causes the data stored in the latch L1 to be at a low level, while in other situations, the data stored in the latch L1 is at a high level. By using the programming control voltages V1 and V2, the data is inverted and then stored at the node A. When the data of the memory cell coupled to the word line WLn+1 is "11", the voltage at the node A is 2.4V, while in other situations, the voltage at the node A is 0V.

Then, the data of the latch L1 is reset, and the voltage of the word line WL is changed. The reading operation for the memory cells coupled to the word line WLn is performed continuously. The pre-charge voltage of the bit line is 1.2V only when the data of the memory cell coupled to the word line WLn+1 is "11", while in other situations, the pre-charge voltage of the bit line is 1.1V. The pre-charge voltage can be controlled by changing the control voltage BLCLAMP (referring to the symbol 101 in FIG. 8). In the beginning, all of the bit lines are set at a predetermined low voltage (such as 1.1V), and then the transistor Q9 receiving the signal REG is turned on, and the node A is at a high level. In other words, the bit lines of the memory cells coupled to the adjacent word line WLn+1 which do not perform the writing operation of the MSB are coupled to the voltage V2. Then, the gate voltage BLCLAMP of the transistor Q2 is controlled to be 1.2V+Vth, so that the bit lines of the memory cells coupled to the word line WLn+1 which do not perform the writing operation of the MSB are raised to a predetermined high voltage (such as 1.2V). By this operation, the pre-charge voltage of the bit lines of the memory cells coupled to the word line WLn+1 which perform the writing operation of the MSB is set as a low voltage. When the pre-charge voltage is lower, the voltage of the bit lines after discharging is lowered, so that the raising of the threshold voltages of the memory cells coupled to the word line WLn+1 caused by the FG-FG coupling effect during the writing operation of the MSB is cancelled out. In the above example, the pre-charge voltages for the two kinds of bit lines are 1.2V and 1.1V. Those pre-charge voltages are set as 1.2V and 1.1V on the condition that the raising of the threshold voltages caused by the FG-FG coupling effect is 0.1V. When the raising of the threshold voltages is 0.05V, the pre-charge voltages for the two kinds of bit lines are 1.2V and 1.15V.

According to the above description, in the first embodiment, in the beginning, all of the bit lines are pre-charged by a predetermined low voltage which is lower than the above pre-charge voltage for the pre-charging operation. Then, when the memory cells coupled to the word line WLn+1 adjacent to the word line WLn are examined to determine that the writing operation of the MSB is performed, the voltages on the bit lines excluding the bit line performing the data reading operation are raised to the pre-charge voltage by controlling the gate voltage BLCLAMP of the transistor Q2 between the circuit (the voltage V1 and the transistor Q10) providing pre-charge voltage and the bit line performing the data reading operation. Accordingly, compared with other bit lines, only the bit line performing the data reading operation is reduced by the raising degree of the threshold voltages caused by the FG-FG coupling effect. Thus, the raising of the threshold voltages of the memory cells coupled to the word line WLn+1 caused by the FG-FG coupling effect during the writing operation of the MSB is cancelled out. The reading failure can be prevented even if the FG-FG coupling effect occurs.

Second Embodiment

Figure 9:
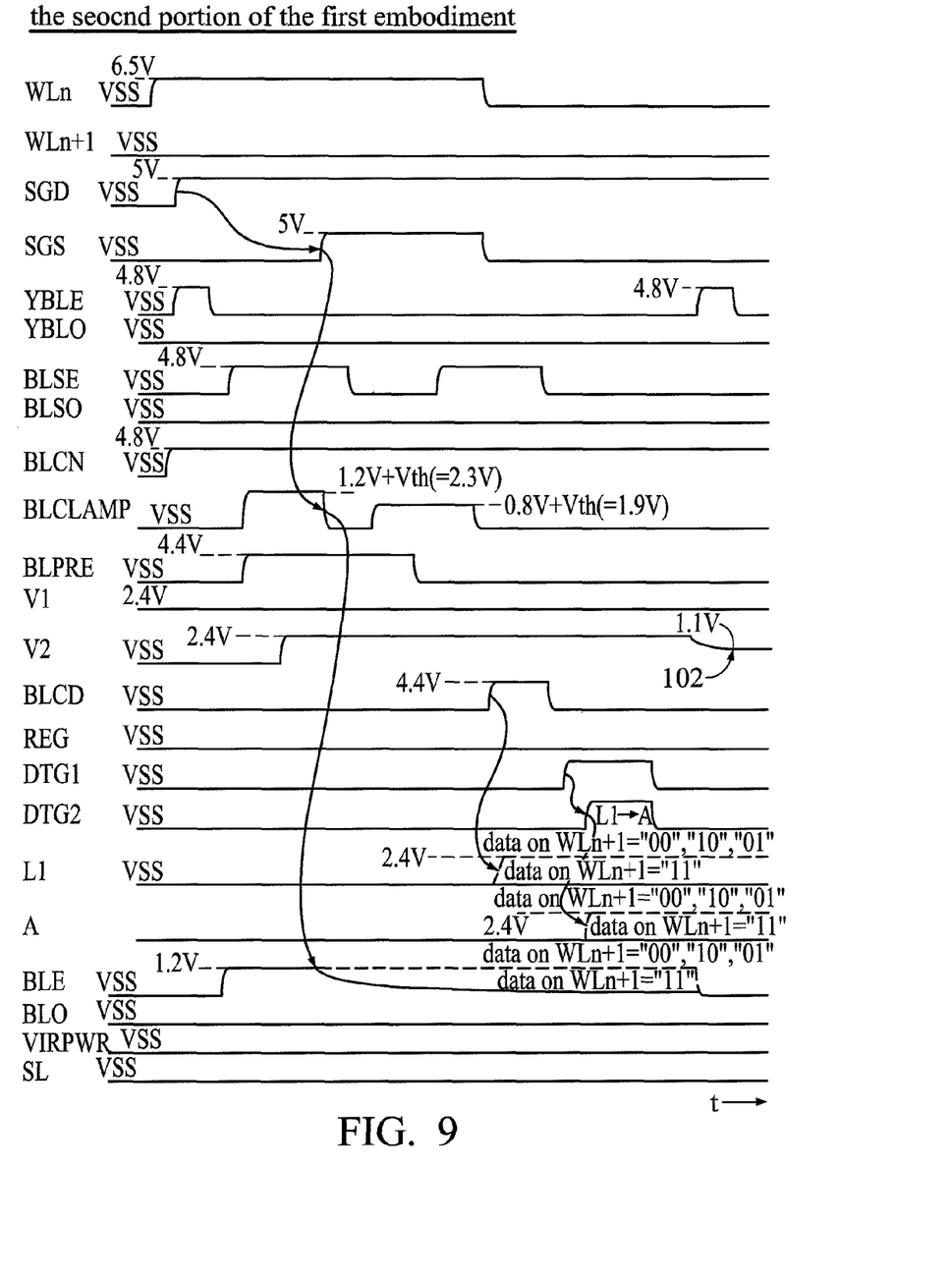
FIG. 9 is a timing chart of the first portion of the reading operation sequence of the NAND-type flash EEPROM according to the second embodiment.
Figure 10:
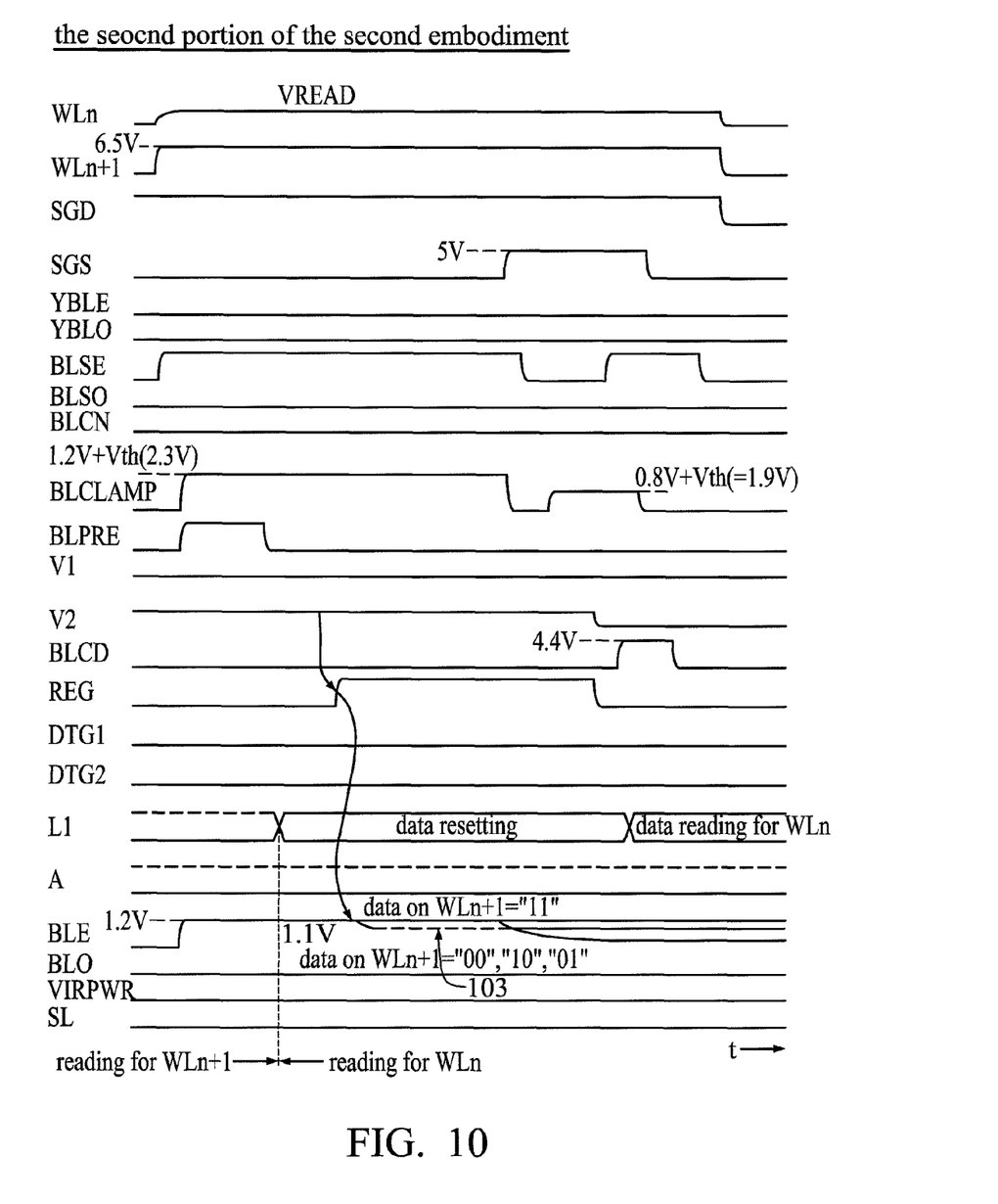
FIG. 10 is a timing chart of the second portion of the reading operation sequence of the NAND-type flash EEPROM according to the second embodiment.

FIGS. 9 and 10 show a timing chart of a reading operation of the NAND-type flash EEPROM of the second embodiment. Different from the first embodiment, the NAND-type flash EEPROM of the second embodiment is characterized in that: the pre-charge voltage of the bit lines are changed by the data of the word line WLn+1. Concretely, the memory cells coupled to the word line WLn+1 adjacent to the word line WLn are examined to determine that the writing operation of the MSB is performed, the bit line performing the data reading operation is coupled to a low voltage source V2 whose voltage is lower than the pre-charge voltage through a supplying circuit (V2, Q8, Q9) which provides a programming voltage coupled to the bit line performing the data reading operation. Accordingly, the pre-charge voltage is reduced by the raising degree of the threshold voltages caused by the FG-FG coupling effect.

Referring to FIGS. 9 and 10, the sequence of the reading operation of the second embodiment is described.

Assume that the memory cells coupled to the word line WLn are the target for the reading operation. First, the reading operation is performed to the memory cells coupled to the word line WLn+1. At this time, the voltage of the word line WLn+1 is the reading voltage, that is VREAD=R1. When the data of one memory cell coupled to the word line WLn+1 is "11", the reading result causes the data stored in the latch L1 to be at a low level, while in other situations, the data stored in the latch L1 is at a high level. By turning on the transistors Q6 and Q7 by the control voltage DTG1 and DTG2, the data stored in the latch L1 is kept at the node A. When the data of the memory cell coupled to the word line WLn+1 is "11", the voltage at the node A is 0V, while in other situations, the voltage at the node A is 2.4V.

Then, the data of the latch L1 is reset, and the voltage of the word line WL is changed. The reading operation for the memory cells coupled to the word line WLn is performed continuously. In the beginning, the pre-charge voltage of the all bit lines is set as 1.2V. However, by setting the control voltage V2 as 1.1V (referring to the symbol 102 in FIG. 9) and turning on the transistor Q9 receiving the REG the pre-charge voltage of the bit line is pulled down from 1.2V to 1.1V (referring to the symbol 103 in FIG. 10) only when the voltage of the node A is at a high level (in the situations excluding that the data of the memory cell coupled to the word line WLn+1 is "11"). By setting the pre-charge voltage at a lower level, the raising of the threshold voltages caused by the FG-FG coupling effect during the writing operation of the MSB on the memory cells coupled to the word line WLn+1 is cancelled out.

According to the description above, in the second embodiment, when the memory cells coupled to the word line WLn+1 adjacent to the word line WLn are examined to determine that the writing operation of the MSB is performed, the bit line performing the data reading operation is coupled to a low voltage source V2 lower than the pre-charge voltage through a supplying circuit (V2, Q8, Q9) which provides a programming voltage coupled to the bit line performing the data reading operation. Accordingly, the pre-charge voltage is reduced by the raising degree of the threshold voltages caused by the FG-FG coupling effect.

Third Embodiment

Figure 11:
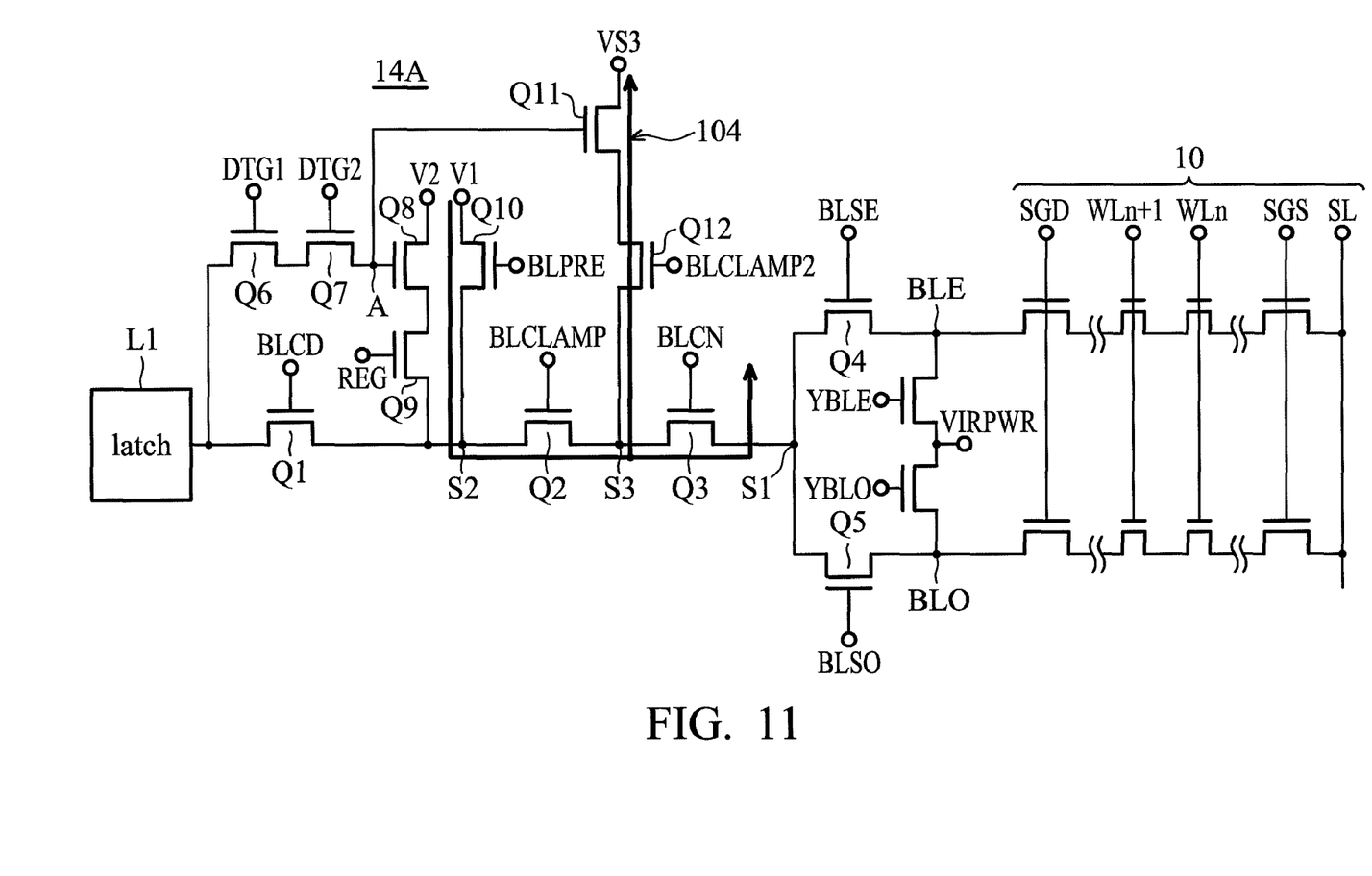
FIG. 11 shows a page buffer 14A and the memory cell array 10 according to the third embodiment.

FIG. 11 shows a page buffer 14A and the memory cell array 10 according to the third embodiment. Compared with the page buffer 14 in FIG. 3, the page buffer 14A in FIG. 11 further comprises a buck circuit for reducing the pre-charge of the bit lines to be lower than the discharging voltage by a predetermined voltage. The buck circuit is different from circuit (V1, Q10) providing the pre-charge voltage, and it is an additionally disposed circuit (VS3, Q11, Q12). One terminal of the buck circuit is coupled to the node S3 between the above circuit (V1, Q10) providing the pre-charge voltage and the bit line, and the other terminal thereof is coupled to the voltage source VS3 which provides the voltage lower than the predetermined value of the discharge voltage. When the memory cells coupled to the word line WLn+1 adjacent to the word line WLn are examined to determine whether the writing operation of the MSB is performed, the pre-charge voltage of the bit lines which are coupled to the word line WLn and perform the data reading operation is coupled to the voltage source VS3 through the externally disposed circuit (VS3, Q11, Q12). Accordingly, the pre-charge voltage is reduced by the raising degree of the threshold voltages caused by the FG-FG coupling effect.

The buck circuit and the operation thereof in the third embodiment will be described by referring to FIG. 11.

In FIG. 11, the buck circuit comprises transistors Q11 and Q12. The node S3 between the transistors Q2 and Q3 is coupled to the voltage source VS3 through the transistor Q12 whose gate is applied by the second bit clamp voltage BLCLAMP2 and the transistor Q11 whose gate is applied by the voltage of the node A between the transistors Q7 and Q8.

In prior arts, when the bit line performing the reading operation is recharged, the control voltage V1 is controlled at a level (1.2V+Vth) which is the sum of 1.2V and the threshold voltage Vth of the transistor Q10 controlled by the gate voltage BLPRE, and the bit lines are pre-charged by 1.2V. In FIG. 11 of the third embodiment, since a transistor Q12 receiving a gate voltage BLCLAMP2 is added, a discharging path for the 1.2 of the bit lines is formed. The degree of the voltage which is reduced from the voltage V2 by applying the voltage 1.2V+Vth can be charged by adjusting the control voltage BLCLAMP2 and the voltage of the voltage source VS3. For example, VS3=1.1V, and BLCLAMP2=1.2V+Vth. The switching transistor Q11 coupled to the transistor Q12 receiving the gate voltage BLCLAMP2 is controlled to be turned on or off according to the data kept at the node A.

Assume that the reading operation is formed to the memory cells coupled to the word line WLn. First, for the word line WLn+1, the predetermined reading voltage R1 (referring to FIG. 4) is checked for reading data, the memory cells coupled to the word line WLn+1 are examined to determine whether the writing operation of the MSB is performed, and then the data is transmitted to the node A in FIG. 11. For the memory cells coupled to the word line WLn+1, the node A in the page buffer corresponding to the address performing the writing operation of the MSB has high-level data. The pre-charge voltage of the bit lines is usually 1.2V when the data reading operation is performed to the memory cells coupled to the word line WLn. However, when the writing operation of the MSB is performed to the memory cells coupled to the word line WLn+1, discharging occurs due to the transistor Q12 receiving the gate voltage BLCLAMP2 (referring to the symbol 104), and the pre-charge voltage may be lower than 1.2V to cancel out the raising of the threshold voltage Vth caused by the FG-FG coupled effect. Moreover, the value BLCLAMP2 can be changed by using conventional internal voltage trimming.

The reading sequence of the third embodiment can be performed by the timing of the first and second embodiments. However, in order to shorten reading time, only the corresponding bit line is pulled down to 1.1V of VS3 during the step of performing the pre-charge operation to all of the nit lines in prior arts.

Following the description above, the third embodiment adds a buck circuit (VS3, Q11, Q12). When the memory cells coupled to the word line WLn+1 adjacent to the word line WLn are examined to determine that the writing operation of the MSB is performed, the pre-charge voltage of the bit lines which are coupled to the word line WLn and perform data reading operation is coupled to the voltage source VS3 through the externally disposed circuit (VS3, Q11, Q12). Accordingly, the pre-charge voltage is reduced by the raised degree of the threshold voltages caused by the FG-FG coupling effect. Thus, the raising of the threshold voltages of the memory cells coupled to the word line WLn+1 caused by the FG-FG coupling effect during the writing operation of the MSB is cancelled out. The reading failure can be prevented even if the FG-FG coupling effect occurs.

In the above embodiments, the situation where the MSB are written into all of the word lines WL is discussed. In practice, the operation of the writing operation of the MSB can be skipped. In this case, the shift of the threshold voltages of the memory cells coupled to the adjacent word line WL caused by the FG-FG coupling effect has not occurred. Thus, in order to indicate whether the writing operation of the MSB is performed, a flag bit is disposed by one page serving as a unit. Thus, in a general sequence, the writing operation of the MSB is checked in the beginning. When the writing operation of the MSB is being performed, the sequence of the above embodiments is used for data reading. If the writing operation of the MSB is skipped, the reading operation is performed by using the similar methods as the prior arts. The memory cell of the flag bit and the memory cell of the data bit have the same state, and, however, the data "10U" is written into one, while the data "00" is written into the other during the writing operation of the MSB.

Moreover, in the above embodiments, for the memory cells coupled to the word line WLn+1 whose data is "01", "10U", and "00", the memory cells coupled to the word line WLn are set as a bit-line pre-charge voltage which is lower the predetermined pre-charge voltage. Referring to FIG. 4, since the shift of the threshold voltage Vth is less in the situation of "10L"→"10U", the FG-FG coupling effect for the memory cells coupled to the word line WLn is degraded. Thus, in the operation sequence, the operation of providing a lower pre-charge voltage is not performed to the situation of the data "10U". In other words, only when the data of the memory cell coupled to the word line WLn+1 is "01" and "00" (the case in FIG. 4), the bit-line pre-charge voltage is set as a low value as the memory cells coupled to the word line WLn perform the reading operation. In another embodiment, only in the situation of the data being "01" and "00", the node A is set at a high level or a low level, and then the operation of the embodiments is performed. The setting of the node A is accomplished by reading the word line WLn+1 by the reading voltages R1, R2, and R3 and then performing calculation in the page buffer 14.

By using gm (A/V), bit-line capacitance $C_{BL}$, and discharging time T which represent the word-line voltage dependence of the memory cell current in the operating memory cell, the reduction degree of the bit-line voltage when the memory cells coupled to the word line WLn+1 perform the writing operation of the MSB and the memory cells coupled to the word line WLn+1 perform the reading operation is represented by $gm \times \Delta Vth \times T/C_{BL}$. For example, assume that the shift of the threshold voltage Vth caused by the FG-FG coupling effect is 0.2V. Then, the reduction degree of the bit-line voltage is 0.1V (=300 nA/V×0.2V×5 μsec/3 pF). $gm \times \Delta Vth$ represents the voltage discharged in the discharging time which is transformed from the reduction of the memory cell current caused by the FG-FG coupling effect.

Variation Embodiment

In the above embodiments, the NAD-type flash EEPROM is given as an example for description, however, without limiting the invention. The invention can applied to other non-volatile semiconductor memory devices which can write data input floating gates, such as NOR-type flash EEPROM.

As described above, in the non-volatile semiconductor memory device and the reading method therefore, when the data reading operation is performed to the memory cells coupled to the first word line, the memory cells coupled to the second word line adjacent to the first word line are examined to determine whether the writing operation of the MSB is performed. If the writing operation of the MSB is performed, the pre-charge voltage of the bit lines performing the data reading operation to the memory cells coupled to the first word line is reduced by a predetermined voltage for canceling out the raising of the threshold voltages caused by the coupling effect between the storage nodes in the memory cells coupled to two adjacent word lines. Accordingly, when the memory cells coupled to the first word line perform the data reading operation, the raising of the threshold voltages Vth caused by the FG-FG coupling effect during the writing operation of the MSB for the memory cells coupled to the second word line is cancelled out. The reading failure can be prevented even if the FG-FG coupling effect occurs.

SYMBOL DESCRIPTION OF THE DRAWINGS

10~memory cell array; 11~control circuit; 12~row decoder; 13~high voltage generation circuit; 14, 14A~ data writing and reading circuit (page buffer); 15~column decoder; 17~command register; 18~address register; 19~operation logic controller; 50~ data input/output buffer; 51~data input/output terminal; 52~data line; L1, L2~latch; MC0-MC15~memory cell; NU0-NU2~NAND cell unit; WL0-WL15~word line; BL, BLE, BLO~bit line; SG1, SG2~selection gate transistor; CELSRC~common source line; SGD, SGS~selection gate line; V1, V2, VIRPWR~voltage; BLPRE, REG, BLCD, DTG1, DTG2, BLCLAMP, BLCLAMP2, BLCN, BLSE, BLSO, YBLE, YBLO~control voltage; A, S1-S3~node, Q1-Q12~transistor; 104~discharging path.

What is claimed is:

1. A non-volatile semiconductor memory device comprising:
   a non-volatile memory cell array for storing at least two bits including a least significant bit (LSB) and a most significant bit (MSB) by using different threshold voltages in each of memory cells of the memory cell array;
   a control circuit for controlling a data reading operation to the memory cell array; and
   a buck circuit;
   wherein when the memory cells coupled to a first word line perform the data reading operation, the memory cells coupled to a second word line adjacent to the first word line are examined to determine whether a writing operation of the MSB is performed;

wherein if the writing operation of the MSB is performed, the buck circuit reduces a pre-charge voltage of a bit line performing a data reading operation to the memory cells coupled to the first word line by a predetermined voltage for canceling out the raising of threshold voltages caused by coupling effect between gates of storage nodes in the memory cells coupled to two adjacent word lines.

2. The non-volatile semiconductor memory device as claimed in claim 1, wherein the buck circuit pre-charges all bit lines by a predetermined low voltage lower than the pre-charge voltage in the beginning, and wherein when the memory cells coupled to the second word line adjacent to the first word line are examined to determine that the writing operation of the MSB is performed, the buck circuit raises voltages on the bit lines excluding the bit line performing the data reading operation to the pre-charge voltage by controlling a gate voltage of a transistor disposed between a first circuit providing the pre-charge voltage and the bit line performing the data reading operation.

3. The non-volatile semiconductor memory device as claimed in claim 1, wherein when the memory cells coupled to the second word line adjacent to the first word line are examined to determine that the writing operation of the MSB is performed, the buck circuit couples the bit line performing the data reading operation to a voltage source whose voltage is lower then the pre-charge voltage through a second circuit for reducing the pre-charge voltage by the predetermined voltage; and wherein the second circuit provides a programming voltage to the bit line performing the data reading operation.

4. The non-volatile semiconductor memory device as claimed in claim 1, wherein the buck circuit serves as a third circuit which is additionally disposed and different from the first circuit providing the pre-charge voltage;

wherein one terminal of the third circuit is coupled to a node between the first circuit and the bit line, and the other terminal thereof is coupled to a voltage source whose voltage is lower than the pre-charge voltage by the predetermined voltage; and wherein when the memory cells coupled to the second word line adjacent to the first word line are examined to determine that the writing operation of the MSB is performed, the pre-charge voltage of the bit line coupled to the first word line and performing the data reading operation is coupled to the voltage source through the third circuit for reducing the pre-charge voltage by the predetermined voltage.

5. The non-volatile semiconductor memory device as claimed in claim 1, wherein the writing operation of the MSB is an operation to write at least one specific level into the MSB.

6. A reading method for a non-volatile semiconductor memory device, wherein the non-volatile semiconductor memory device comprises a non-volatile memory cell array for storing at least two bits including a least significant bit (LSB) and a most significant bit (MSB) by using different threshold voltages in each of memory cells of the memory cell array and a control circuit for controlling a data reading operation to the memory cell array, the reading method comprises:

when the memory cells coupled to a first word line perform the data reading operation, examining the memory cells coupled to a second word line adjacent to the first word line to determine whether a writing operation of the MSB is performed; and if the writing operation of the MSB is performed, reducing a pre-charge voltage of a bit line performing a data reading operation to the memory cells coupled to the first word line by a predetermined voltage for canceling out raising of the threshold voltages caused by the coupling effect between gates of storage nodes in the memory cells coupled to two adjacent word lines.

7. The reading method as claimed in claim 6, wherein the step of reducing the pre-charge voltage comprises:

pre-charging all bit lines by a predetermined low voltage which is lower than the pre-charge voltage in the beginning; and when the memory cells coupled to the second word line adjacent to the first word line are examined to determine that the writing operation of the MSB is performed, raising voltages on the bit lines, excluding the bit line performing the data reading operation, to the pre-charge voltage by controlling a gate voltage of a transistor disposed between a first circuit providing the pre-charge voltage and the bit line performing the data reading operation.

8. The reading method as claimed in claim 6, wherein the step of reducing the pre-charge voltage comprises:

when the memory cells coupled to the second word line adjacent to the first word line are examined to determine that the writing operation of the MSB is performed, coupling the bit line performing the data reading operation to a voltage source whose voltage is lower then the pre-charge voltage through a second circuit for reducing the pre-charge voltage by the predetermined voltage; and wherein the second circuit provides a programming voltage to the bit line performing the data reading operation.

9. The reading method as claimed in claim 6, wherein the non-volatile semiconductor memory device further comprises a third circuit which is different from the first circuit providing the pre-charge voltage and disposed additionally;

wherein one terminal of the third circuit is coupled to a node between the first circuit and the bit line, and the other terminal thereof is coupled a voltage source whose voltage is lower than the pre-charge voltage by the predetermined voltage; and wherein the step of reducing the pre-charge voltage comprises:

when the memory cells coupled to the second word line adjacent to the first word line are examined to determine that the writing operation of the MSB is performed, coupling the pre-charge voltage of the bit line coupled to the first word line and performing the data reading operation to the voltage source through the third circuit for reducing the pre-charge voltage by the predetermined voltage.

10. The reading method as claimed in claim 6, wherein the writing operation of the MSB represents an operation to write at least one specific level into the MSB.

* * * * *